US005473155A

United States Patent [19]
Iwasaki et al.

[11] Patent Number: 5,473,155
[45] Date of Patent: Dec. 5, 1995

[54] PHOTOMETRIC SENSOR

[75] Inventors: Hiroyuki Iwasaki, Kawasaki; Tadao Takagi, Yokohama; Tetsuro Goto, Funabashi; Yasuhito Maki, Atsugi, all of Japan

[73] Assignees: Nikon Corporation; Sony Corporation, both of Tokyo, Japan

[21] Appl. No.: 273,928

[22] Filed: Jul. 12, 1994

[30] Foreign Application Priority Data

Jul. 15, 1993 [JP] Japan ................................. 5-175203

[51] Int. Cl.⁶ .................................................. H01J 40/14
[52] U.S. Cl. ................................. 250/208.1; 250/208.2; 358/311; 358/314
[58] Field of Search ........................... 250/208.1, 208.2, 250/214 C; 348/230, 302–304, 311, 314, 315, 321

[56] References Cited

U.S. PATENT DOCUMENTS

| | | | |
|---|---|---|---|
| 4,500,915 | 2/1985 | Koike et al. | 348/321 |
| 4,809,073 | 2/1989 | Chiba et al. | 348/314 |
| 4,856,033 | 8/1989 | Hirota | 348/314 |
| 5,083,207 | 1/1992 | Ishida et al. | 348/314 |
| 5,132,803 | 7/1992 | Suga et al. | 348/321 |

FOREIGN PATENT DOCUMENTS 63-168613  7/1988  Japan.

Primary Examiner—Stephone B. Allen
Attorney, Agent, or Firm—Oliff & Berridge

[57] ABSTRACT

The photometric sensor of the present invention includes a plurality of photoelectric conversion elements which accumulate electric charge according to the intensity of the light which is incident upon them; a CCD shift register, comprising a plurality of CCD (Charge Coupled Device) elements which correspond respectively to the plurality of photoelectric conversion elements, and at least one relay CCD element which does not correspond to any one of the photoelectric conversion elements, and which reads in the accumulated electric charges from the plurality of photoelectric conversion elements to the plurality of CCD elements and transmits them via the relay CCD element; a charge to voltage conversion circuit which converts the accumulated electric charges transmitted from the CCD shift register into photometric signals and outputs them in order; and a timing signal generation circuit which, when the photometric signals from the charge to voltage conversion circuit originating from the plurality of photoelectric conversion elements are output, outputs in synchronism with this output a timing signal, and, when a signal from the charge to voltage conversion circuit originating from the relay CCD element is output, does not output the timing signal in synchronism with this output.

6 Claims, 7 Drawing Sheets

PHOTOMETRIC SENSOR

BACKGROUND OF THE INVENTION

1. Field of the Invention

The present invention relates to a photometric sensor which performs photometry by using a plurality of photoelectric conversion elements, and which outputs photometric signals in time series.

2. Description of the Related Art

A photometric sensor is per se known, which performs photometry by using a plurality of photoelectric conversion elements, and which outputs photometric signals in time series (refer to Japanese Patent Laid-open Application No. 63-168613).

FIG. 8 is a functional block diagram showing the overall construction of an example 1 of this type of photometric sensor. Referring to this figure, a photoelectric conversion section 2 comprises a plurality of photoelectric conversion elements 3a through 3g arranged in a one dimensional array, and a CCD (Charge Coupled Device) shift register 4 for transmitting electric charges. Each of the photoelectric conversion elements 3a through 3g generates and accumulates electric charge according to the strength of the light which is incident upon it. The CCD shift register 4 comprises a plurality of CCD elements 4a through 4g provided in respective correspondence to the photoelectric conversion elements 3a through 3g, and a pair of relay CCD elements 4h and 4i provided for relay purposes which do not correspond to any of the photoelectric conversion elements 3a through 3g. Each of the former CCD elements 4a through 4g receives the electric charge which has been accumulated by its corresponding one of the photoelectric conversion elements 3a through 3g and transmits it. On the other hand, the latter relay CCD elements 4h and 4i relay to a charge to voltage conversion circuit 6 the electric charges transmitted from the CCD elements 4a through 4g which they receive. A control section 5 controls these processes of electric charge accumulation and charge transmission via the CCD shift register 4 performed by the photoelectric conversion section 2. Further, the charge to voltage conversion circuit 6 converts the electric charges which are output in order from the CCD shift register 4 into a voltage signal Vout.

These electric charges which have been accumulated are output from the CCD shift register 4 upon the input of a clock pulse Φ1 which is transmitted from a clock pulse generator not shown in the figure, and by the charge to voltage conversion circuit 6 are output to an A/D converter 8 after being converted into the voltage signal Vout. At this time, a timing signal ADT is output from the control section 5 to the A/D converter 8 in order to initiate A/D conversion. The A/D converter 8 performs A/D conversion of the voltage signal Vout at a timing determined by the receipt of the timing signal ADT, and a microcomputer 7 performs photometric calculations based upon the photometric data which are A/D converted in this manner into a digital signal.

Further, it can also happen that, while the relay CCD elements 4h and 4i of the CCD shift register 4 are inputting the electric charges directly from the photoelectric conversion elements 3a through 3g, initial electric charges also are from the beginning in existence upon these relay CCD elements 4h and 4i. Although these initial electric charges on the relay CCD elements 4h and 4i represent meaningless data, during charge transmission this meaningless data is also output in order from the photometric sensor 1 according to the timing signal ADT. In the exemplary photometric sensor shown in FIG. 8 and described above, in order, first the meaningless data item arising from the initial electric charge upon the relay CCD element 4i is output, next the meaningless data item arising from the initial electric charge upon the relay CCD element 4j is output, and subsequently the photometric data items arising as the results of the processes of photoelectric conversion performed by the photoelectric conversion elements 3g, 3f, . . . are output in sequence. Because the data from these relay CCD elements 4h and 4i is data which is not required, this unnecessary data due to the relay CCD elements 4h and 4i must be extracted and deleted from the data read out in order from the CCD shift register 4.

In this connection, in the case of a prior art photometric sensor 1, the position of the relay CCD elements 4h and 4i upon the CCD shift register 4 for electric charge transmission is recorded in advance in the memory of the microcomputer 7, and the data from the relay CCD elements 4h and 4i (which is not required) is extracted and is deleted from among the data input from the CCD shift register 4 via the A/D converter 8, so that only the photometric data from the photoelectric conversion elements 3a through 3g is read in by the microcomputer 7 and is used for performing the processes of photometric calculation.

In a prior art photometric sensor of the type described above the photoelectric conversion elements are arranged in a one dimensional array, and, since also a certain number of such relay CCD elements are provided for example at the leading end and/or at the trailing end of the CCD shift register, it is comparatively easy for the microcomputer to distinguish the data arising from these relay CCD elements, which is not required.

However, with a photometric sensor of the type in which a plurality of photoelectric conversion elements are arranged in a two dimensional array and perform photoelectric conversion over a two dimensional plane surface, it is necessary to provide, not only a plurality of linear CCD shift registers each extending for example along the X axis direction and collecting electric charges from a plurality of photoelectric conversion elements, but also another CCD shift register extending for example along the Y axis direction and collecting the electric charges which are transmitted from these X axis CCD shift registers. In this type of construction, since relay CCD elements are provided for the various CCD shift registers in a similar manner to that outlined above, various items of meaningless data, which are not required, arising from the initial charges on these relay CCD elements come to be mixed into the data signals output from the Y axis direction CCD shift register, along with the items of photometric data from the photoelectric conversion elements, which are required, in a relatively complex manner. For this reason, the processing required from the microcomputer in order to eliminate these meaningless data items becomes relatively complicated, and a problem arises with regard to the amount of processing time required.

SUMMARY OF THE INVENTION

The objective of the present invention is to provide a photometric sensor improved so that the photometric signals can be read out easily, by the timing signal being output only when the photometric signals from the photoelectric conversion elements are being output via the CCD shift registers.

In order to attain this objective, the present invention proposes a photometric sensor, comprising: a plurality of photoelectric conversion elements which accumulate electric charge according to the intensity of the light which is incident upon them; a CCD shift register, comprising a plurality of CCD (Charge Coupled Device) elements which correspond respectively to said plurality of photoelectric conversion elements, and at least one relay CCD element which does not correspond to any one of said photoelectric conversion elements, and which reads in the accumulated electric charges from said plurality of photoelectric conversion elements to said plurality of CCD elements and transmits them via said relay CCD element; a charge to voltage conversion circuit which converts the accumulated electric charges transmitted from said CCD shift register into photometric signals and outputs them in order; and a timing signal generation circuit which, when the photometric signals from said charge to voltage conversion circuit originating from said plurality of photoelectric conversion elements are output, outputs in synchronism with this output a timing signal, and, when a signal from said charge to voltage conversion circuit originating from said relay CCD element is output, does not output said timing signal in synchronism with this output.

According to the present invention as described above, when the charge to voltage conversion circuit is outputting photometric signals which originate from the plurality of photoelectric conversion elements, the timing signal generation circuit outputs the timing signal in synchronism with the output of this photometric signal; while on the other hand, when the charge to voltage conversion circuit is outputting a signal originating from the relay CCD element, the timing signal generation circuit does not output the timing signal in synchronism with the output of this signal.

By doing this, in a microcomputer or A/D converter which inputs these photometric signals from this photometric sensor, it is possible easily to ensure that only the photometric signals are read in, without any extraneous data items being read in which are not required, simply by ensuring that the photometric signals are only read in when the timing signal is being output. Thereby the non required signal from the relay CCD element is not read in, i.e. is eliminated.

DETAILED DESCRIPTION OF THE PREFERRED EMBODIMENT

Figure 1:
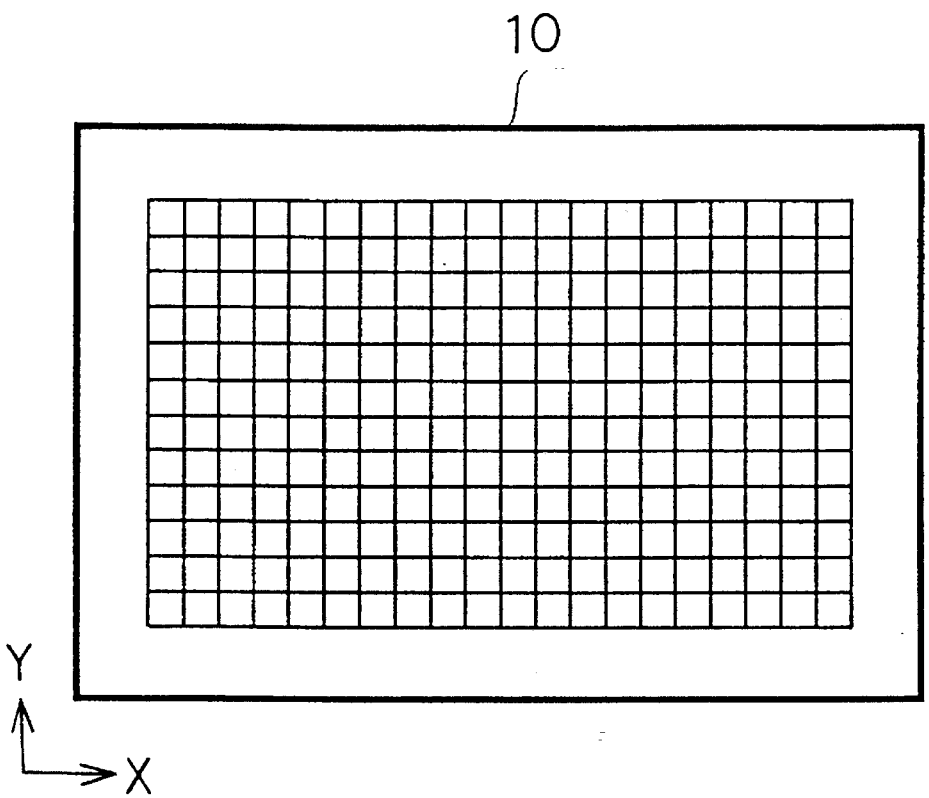
FIG. 1 is a schematic view showing the overall two dimensional layout of 240 photometric regions which are defined upon the surface of a photometric sensor according to the preferred embodiment of the present invention.
Figure 2:
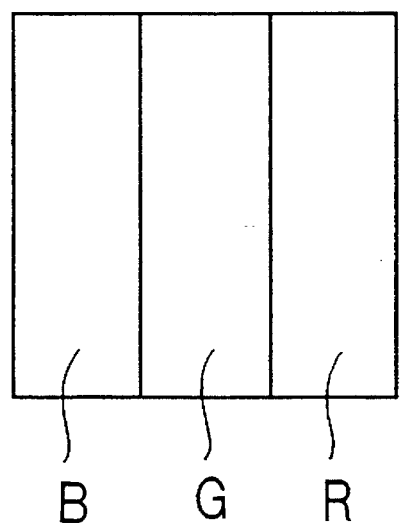
FIG. 2 is a detail of FIG. 1, showing the manner in which an exemplary one of the photometric regions of this photometric sensor is separated into B, G, and R sub-regions.

The preferred embodiment of the present invention will now be explained with reference to FIGS. 1 through 7. FIG. 1 shows the overall two dimensional layout of the photometric regions on the surface of a photometric sensor 10 according to the preferred embodiment of the present invention. The surface of this photometric sensor 10 is divided into 240 photometric regions, 20 along the X axis direction (horizontally in the figure) by 12 along the Y axis direction (vertically in the figure). As shown in FIG. 2, each of these photometric regions is further subdivided (along its X axis direction) into three sub-regions designated as B, G, and R, which are for performing photometry for the blue, green, and red light respectively incident thereupon, and, as will be explained shortly, corresponding to each of these sub-regions there is provided a photoelectric conversion element sensitive to light in the appropriate frequency range. Thus 720 photoelectric conversion elements in all are provided, 60 along the X axis direction by 12 along the Y axis direction.

Figure 3:
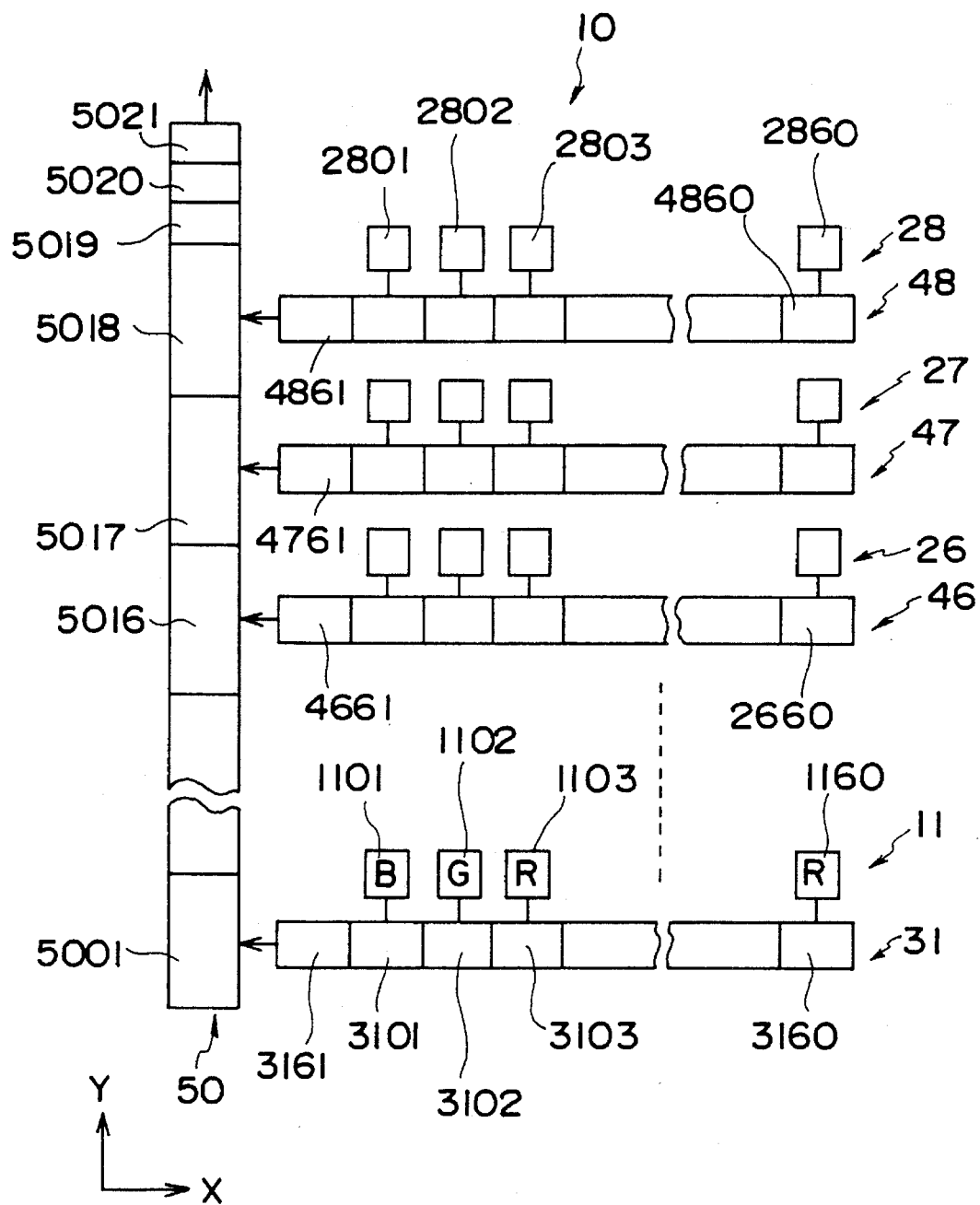
FIG. 3 is an enlarged partial plan view showing certain details of the construction of this preferred embodiment of the photometric sensor of the present invention, and particularly showing the arrangement of certain photoelectric conversion elements and of certain CCD shift registers which are incorporated therein.

FIG. 3 is an enlarged partial plan view of the surface of this photometric sensor 10, showing the arrangement of certain exemplary ones of these photoelectric conversion elements, and others, and of certain CCD shift registers. The surface of this photometric sensor 10 is provided with 18 rows in all of photoelectric conversion elements which extend along the X axis direction and are stacked above one another in the Y axis direction, which will be termed photoelectric conversion element row 11, photoelectric conversion element row 12, . . . photoelectric conversion element row 28; and each of these photoelectric conversion element rows contains 60 individual photoelectric conversion elements. Each of the 60 individual photoelectric conversion elements included in each of the photoelectric conversion element rows 11 through 28 will be designated herein by the conjunction of the symbol "11" through "28" for its photoelectric conversion element row (in order along the Y axis direction) with the sub-index "1" through "60" (in order along the X axis direction), so that for example the reference symbol for the second photoelectric conversion element in the first photoelectric conversion element row 11 is "1102". Moreover, some of the photoelectric conversion elements are not shown in FIG. 3 for the purposes of simplicity of illustration, and similarly the reference symbols for portions of the construction are omitted for clarity.

An X axis direction CCD shift register is provided for each of the rows 11 through 28 of photoelectric conversion elements, and in order along the Y axis these will herein be designated CCD shift register 31, CCD shift register 32, . . . . CCD shift register 48; so that the reference numeral for each X axis CCD shift register will be the reference numeral for its corresponding photoelectric conversion element row, plus twenty. Each of the X axis CCD shift registers 38 through 48 comprises a plurality of CCD elements corresponding respectively to the photoelectric conversion elements included in the respective one of the photoelectric conversion element rows 11 through 28, and one relay CCD element which does not correspond to any photoelectric conversion element.

Each of the former CCD elements receives input of electric charge which has been generated and accumulated by its corresponding photoelectric conversion element, and transmits it in the negative direction along the X axis. And each of these CCD elements will be designated herein by the conjunction of the symbol "31" through "48" for its X axis CCD shift register (in order along the Y axis direction) with the sub-index "1" through "60" (in order along the X axis direction), so that for example the reference symbol for the second CCD element in the first X axis CCD shift register 31 will be "3102". Thus the reference numeral for each of these CCD elements will be greater by 2000 than the reference numeral for its corresponding photoelectric conversion element.

On the other hand, the latter relay CCD elements relay the electric charges, which are transmitted from the former plurality of CCD elements 3101 through 4860 which correspond to the plurality of photoelectric conversion elements 1101 through 2860, to a Y axis direction CCD shift register 50. For each X axis shift register 31 through 48, the corresponding one of these relay CCD elements will be designated herein by the conjunction of the symbol "31" through "48" for its X axis CCD shift register (in order along the Y axis direction) with the numeral "61", so that for example the reference symbol for the relay CCD element in the first X axis CCD shift register 31 will be "3161".

A CCD shift register 50 which extends in the Y axis direction comprises CCD elements 5001 through 5018 which correspond respectively to the X axis CCD shift registers 31 through 48, and further comprises three relay CCD elements 5019, 5020, and 5021. And this Y axis CCD shift register 50 transmits the electric charges which are input from the various X axis CCD shift registers 31 through 48 in the positive direction along the Y axis.

The photoelectric conversion elements 1101 through 2260 of the photoelectric conversion element rows 11 through 22 correspond to the photometric regions described above with reference to FIGS. 1 and 2, and each of them generates and accumulates electric charge according to the intensity of the light which is incident upon it; and they output these accumulated charges in parallel to the CCD elements 3101 through 4260 of their corresponding X axis CCD shift registers 31 through 42 at a fixed timing. Further, the photoelectric conversion elements of the photoelectric conversion element rows 23 through 28 are elements for providing photoelectric conversion signals for performing dark signal compensation, temperature compensation, and the like, and similarly they output their accumulated charges in parallel as compensation signals to the CCD elements 4301 through 4860 of their corresponding X axis CCD shift registers 43 through 48 at a fixed timing.

Each of the X axis CCD shift registers 31 through 48 transmits these accumulated electric charges in the negative direction along the X axis along with the input of a transmission clock pulse, so that these electric charges are output to the Y axis CCD shift register 50 via the relay CCD elements 3161, 3261, . . . 4861 which are provided between the respective X axis CCD shift registers 31 through 48 and the Y axis CCD shift register 50. And the Y axis CCD shift register 50, along with inputting the electric charges transmitted from the various X axis CCD shift registers 31 through 48 each time it receives input of a transmission clock pulse, also transmits these accumulated electric charges which have been inputted in the positive direction along the Y axis and outputs them via the relay CCD elements 5019, 5020, and 5021 upon each transmission clock pulse.

Figure 4:
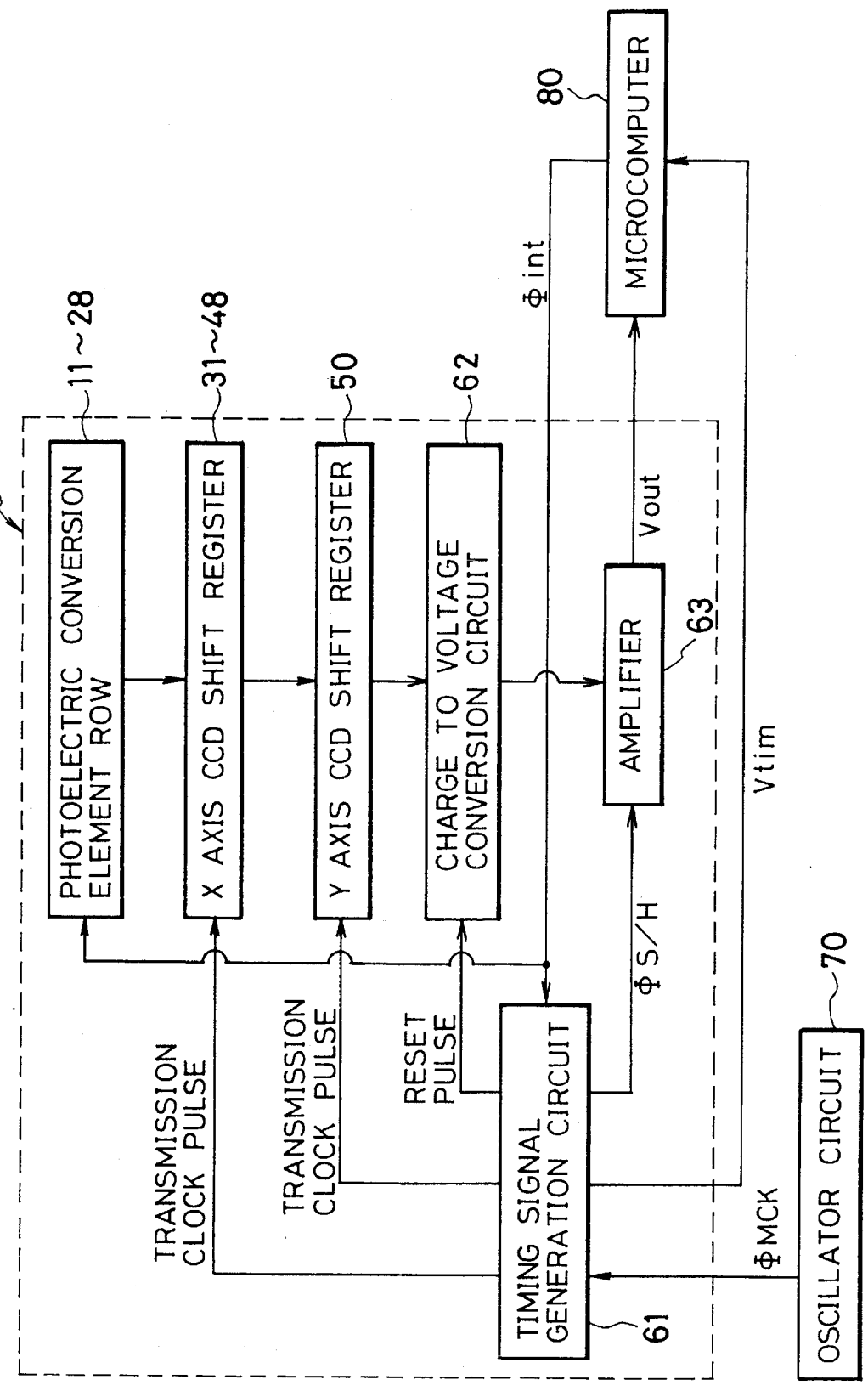
FIG. 4 is a functional block diagram showing the overall construction of this preferred embodiment of the photometric sensor of the present invention.

FIG. 4 is a functional block diagram showing the overall construction of this preferred embodiment of the photometric sensor of the present invention. A master clock signal ΦMCK is supplied from an external oscillator circuit 70 to a timing signal generation circuit 61, and also a signal Φint for commanding the start and the termination of charge accumulation is supplied from a microcomputer 80. The timing signal generation circuit 61, based upon this master clock signal ΦMCK and upon this charge accumulation control signal Φint, generates a transmission clock pulse signal for driving the X axis CCD shift registers 31 through 48 and the Y axis CCD shift register 50, reset pulses for resetting a charge to voltage conversion circuit 62, a signal ΦS/H for sample holding the output signal Vout from an amplifier 63, and a timing signal Vtim for inputting this output signal Vout to the microcomputer 80.

The photoelectric conversion elements 1101 through 2860 of the photoelectric conversion element rows 11 through 28 accumulate electric charge according to the intensity of the light which is incident upon the above described photometric regions under the control of the charge accumulation control signal Φint from the microcomputer 80, and output these accumulated charges in parallel to the CCD elements 3101 through 4860 of their corresponding X axis CCD shift registers 31 through 48 when this charge accumulation process is completed. Each time that a transmission clock pulse is inputted, each of the X axis CCD shift registers 31 through 48 transmits the accumulated electric charge from a single one of its photoelectric conversion elements to the corresponding one of the CCD elements 5001 through 5018 of the Y axis CCD shift register 50. And at this time the Y axis CCD shift register 50, when it thus receives at each of its CCD elements 5001 through 5018 from the corresponding one of the X axis CCD shift registers 31 through 48 the electric charge from a single one of those of the photoelectric conversion elements which correspond to that X axis shift register, transmits these electric charges in order to the charge to voltage conversion circuit 62, each time that a transmission clock pulse is received. At this time, the photometric data from the CCD elements 5001 through 5018 is transmitted in order to the charge to voltage conversion circuit 62, along with meaningless data, which is not required, from the relay CCD elements 5019, 5020, and 5021. Moreover, this series of processes is termed one transmission cycle of the Y axis CCD shift register 50.

When a single transmission cycle of the Y axis CCD shift register 50 has been completed, a transmission clock pulse is again supplied to each of the X axis CCD shift registers 31 through 48, and again each of the X axis CCD shift registers 31 through 48 transmits the accumulated electric charge from a single one of its photoelectric conversion elements to the corresponding one of the CCD elements 5001 through 5018 of the Y axis CCD shift register 50. And the Y axis CCD shift register 50, in this second transmission cycle, again transmits to the charge to voltage conversion circuit 62 these electric charges which it has thus received at each of its CCD elements 5001 through 5018 from the corresponding one of the X axis CCD shift registers 31 through 48. Thereafter the above described process is repeated until the transmission of all of the photometric data from all of the photoelectric elements 1101 through 2860 to the charge to voltage conversion circuit 62 has been completed. Moreover, in the second and subsequent transmission cycles of the Y axis CCD shift register 50, a reference voltage Vref is supplied to its relay CCD element 5019, so that this reference voltage Vref is output as data. The charge to voltage conversion circuit 62 converts the electric charges which it inputs from the Y axis CCD shift register 50 into voltage values which are proportional to their charge values, and outputs these voltage values to the amplifier 63. And the amplifier 63 amplifies these voltage signals and outputs them to the microcomputer 80 as a photometric signal Vout.

Figure 5:
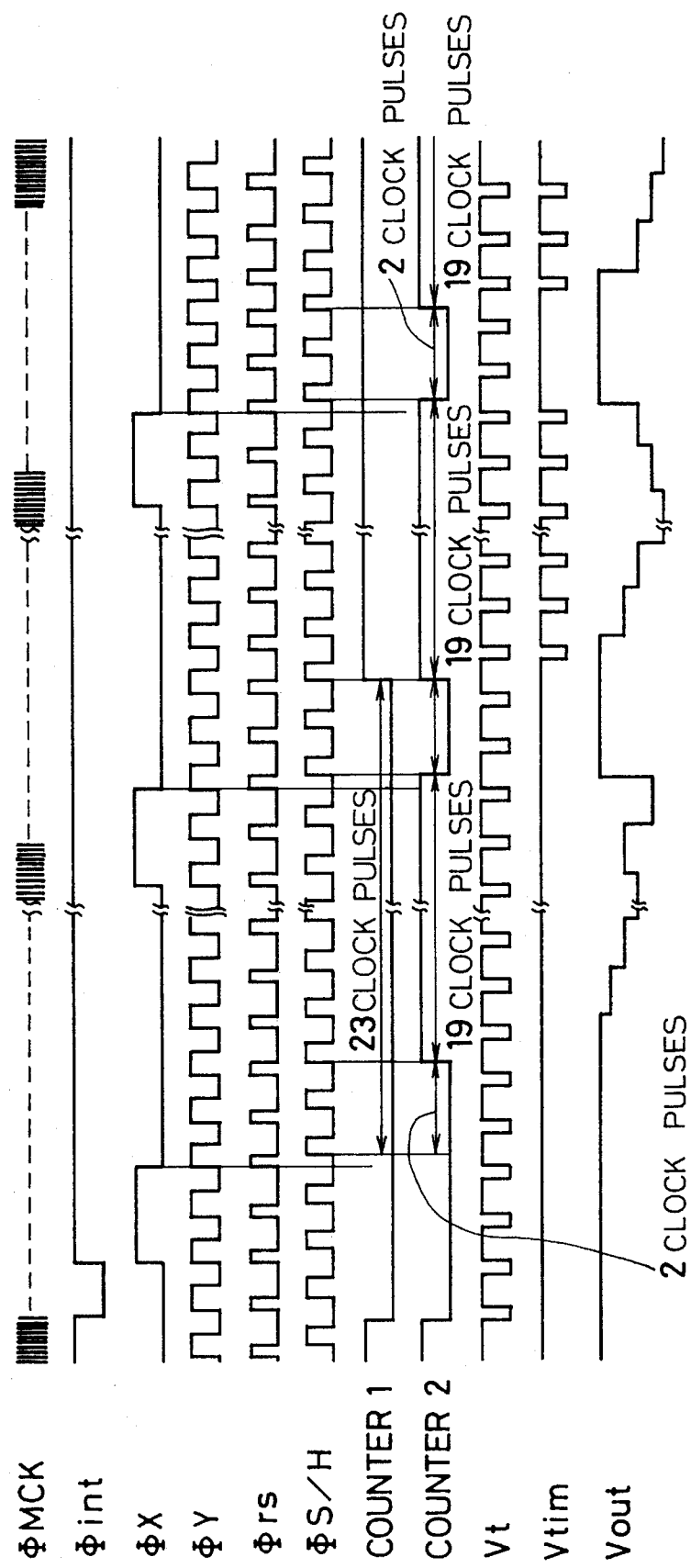
FIG. 5 is a timing chart, showing the operation of the various sections of this preferred embodiment of the photometric sensor of the present invention.

FIG. 5 is a timing chart which shows the operation of the various sections of this photometric sensor 10. The master clock signal ΦMCK is a clock pulse of period between approximately 1/16 and approximately 1/32 of the output period of the signal Vout. (Hereinafter this signal Vout will be termed the reference clock signal.) The charge accumulation control signal Φint is a signal for commanding the start and the termination of charge accumulation, and when this signal Φint transits from high level to low level (i.e., upon its descending slope) charge accumulation is started, while on the other hand when this signal Φint transits from low level to high level (i.e., upon its ascending slope) charge accumulation is terminated. Accordingly, the time period when this signal Φint is at low level is the charge accumulation time period. ΦX and ΦY are the transmission clock pulse signals for, respectively, the X axis CCD shift registers 31 through 48 and the Y axis CCD shift register 50, and when one pulse of either of these signals is received by its corresponding CCD shift register (or registers), it (or they) transmits the electric charge for a single photoelectric conversion element. Φrs is a reset pulse for the charge to voltage conversion circuit 62, and the charge to voltage conversion circuit 62 is reset by this reset pulse every time that it has converted the electric charge for a single photoelectric conversion element into a voltage value. ΦS/H is a pulse signal for performing sample holding of the output pulse signal Vout of the amplifier 63, and sample holding of the pulse signal Vout is performed in synchronism with the descending slope of this pulse signal ΦS/H. Moreover, the period of this pulse signal ΦS/H is the same as the period of the reference clock signal.

The signals from two counters (not particularly shown in FIG. 4) denoted as counter 1 and counter 2, and Vt, are internal pulse signals for generation of the timing signal Vtim. The signal from counter 1 is reset to low level in synchronism with the descending slope of the charge accumulation control signal Φint, and returns to high level after 23 times the period of the reference clock signal, i.e. returns to high level after a time period for the output signal Vout which corresponds to 23 data items has been counted, from the time point at which ΦX has changed to low level after the signal Φint has again returned to high level. As described above, in the first of the transmission cycles of the Y axis CCD shift register 50, eighteen items of non required data from the relay CCD elements 3161, 3261, . . . 4861 of the eighteen X axis CCD shift registers 31 through 48 are input to the CCD elements 5001 through 5018 thereof, and therefore a total of 21 items of non required data is transmitted, including the three further items of non required data from the relay CCD elements 5019 through 5021. Further, in the second and subsequent ones of these transmission cycles, when outputting data from the relay CCD element 5019, the reference voltage Vref is output as data, while only the other two relay CCD elements 5020 and 5021 output items of non required data. In other words, when the transmission of electric charge from the Y axis CCD shift register 50 commences, 21 items of non required data for the first transmission cycle, and the first two items of data in the second transmission cycle, are output as a total of 23 items of non required data in succession. The counter 1 counts these 23 items of non required data, and has the effect that, when the signal Vout for these non required data items is being outputted from the amplifier 63, the timing signal Vtim is not output to the microcomputer 80.

The counter 2 is reset to low level in synchronism with the descending slope of the charge accumulation control signal Φint, and returns to high level after 2 times the period of the reference clock signal, i.e. returns to high level after a time period for the output signal Vout which corresponds to two data items has been counted, from the time point at which ΦX has changed to low level after the signal Φint has again returned to high level, and next, again returns to low level after 19 times the period of the reference clock signal, i.e. after a time period for the output signal Vout which corresponds to 19 data items has been counted. Subsequently the above described operation is repeated, until the electric charges for all of the photoelectric conversion elements 1101 through 2860 have been outputted. In other words, the counter 2 counts the two items of non required data from the relay CCD elements 5021 and 5020 at the head of the Y axis CCD shift register 50, and acts so that, when these two non required data items are being output, the timing signal Vtim is not output to the microcomputer 80.

Vt is a pulse signal which is synchronized with the output of the signal Vout from the amplifier 63, and, when the output of the amplifier 63 is sample held by the sample hold pulse signal ΦS/H and the output signal Vout has been stabilized, ensures a moderate delay for its descending slope. The pulse signal Vt is output as a timing signal Vtim only when the pulse signals output from the counter 1 and the counter 2 are both high level, and by this, the timing signal Vtim is output to the microcomputer 80 only when the photometric signal Vout of the photoelectric conversion elements 1101 through 2860 is being output from the amplifier 63, while the timing signal Vtim is not output when the output signal Vout for the non required data from the relay CCD elements 3161 etc. is being output. By reading in the output signal Vout from the amplifier 63 in synchronism with the timing signal Vtim, the microcomputer 80 is able easily to read in and separate the photometric signal from the output signal Vout, which includes the non required data from the relay CCD elements.

Figure 6:
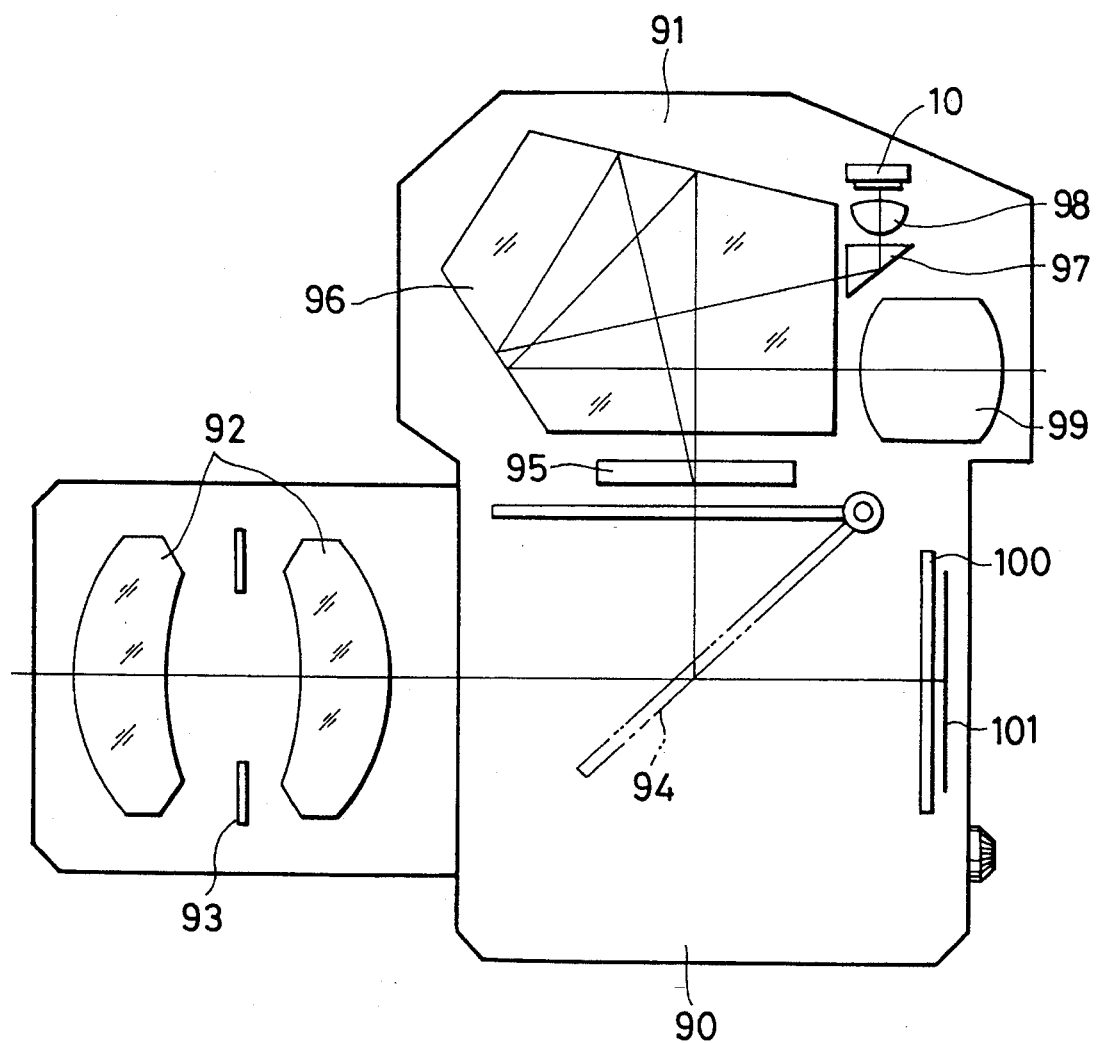
FIG. 6 is a sectional view of a camera which is equipped with this preferred embodiment of the photometric sensor of the present invention.

FIG. 6 is a sectional view of a camera, designated by the reference numeral 90, which is equipped with this preferred embodiment of the photometric sensor of the present invention. The photometric sensor 10 is provided within a viewfinder 91 of the camera 90, and is used for determining the brightness of the object to be photographed. When performing photometry, a light bundle from the object which has passed through a photographic lens 92 and an iris 93 is reflected by a main mirror 94 which is held in a position in which it intercepts the photographic path as shown by the dotted lines, and is directed upon the photometric sensor 10 via a viewfinder screen 95, a pentaprism 96, a prism 97, and a focusing lens 98. Further, the reference numeral 99 denotes an eyepiece lens, while 100 denotes a shutter and 101 denotes a film.

Figure 7:
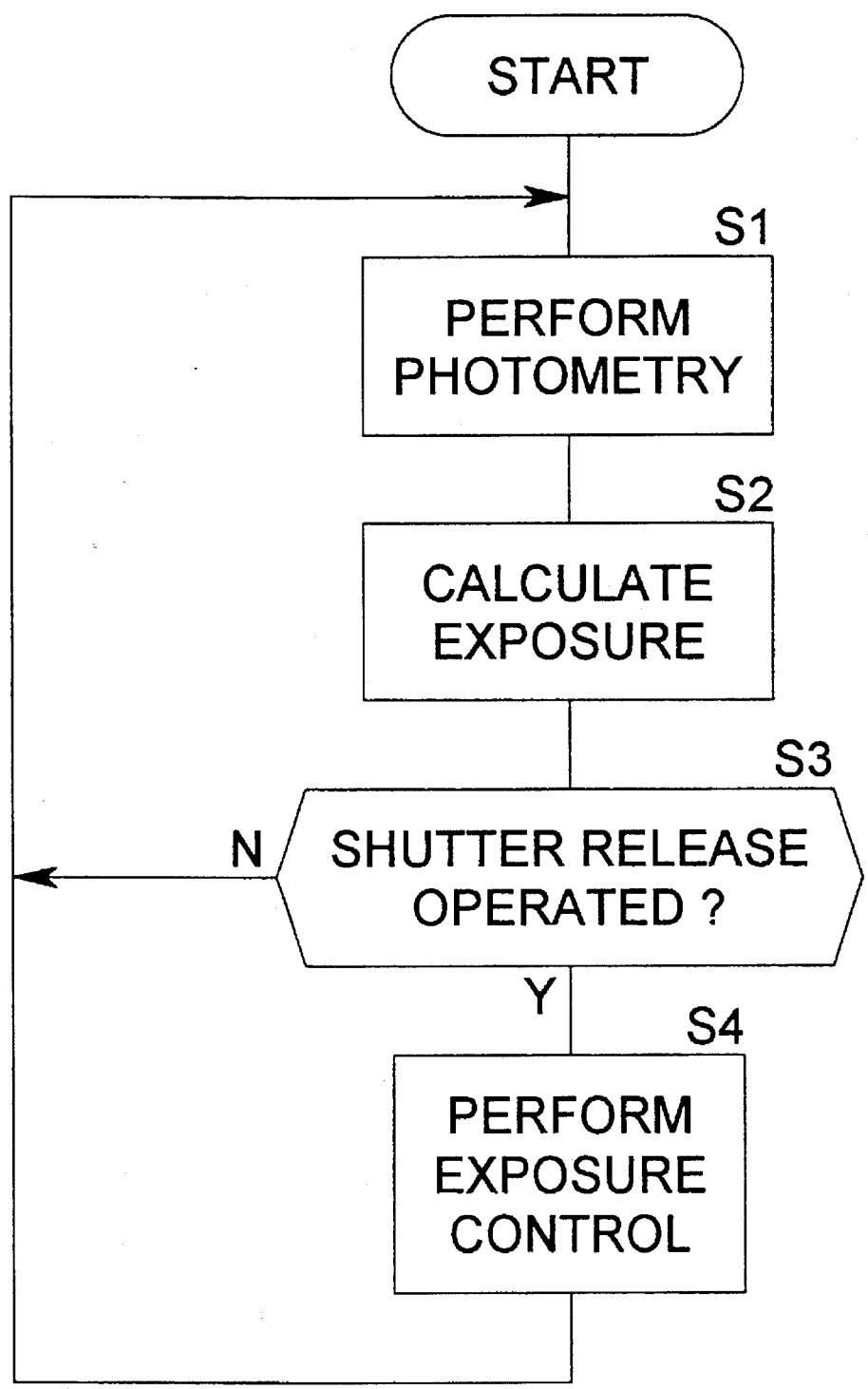
FIG. 7 is a flow chart for outline explanation of the operation of the FIG. 6 camera.
Figure 8:
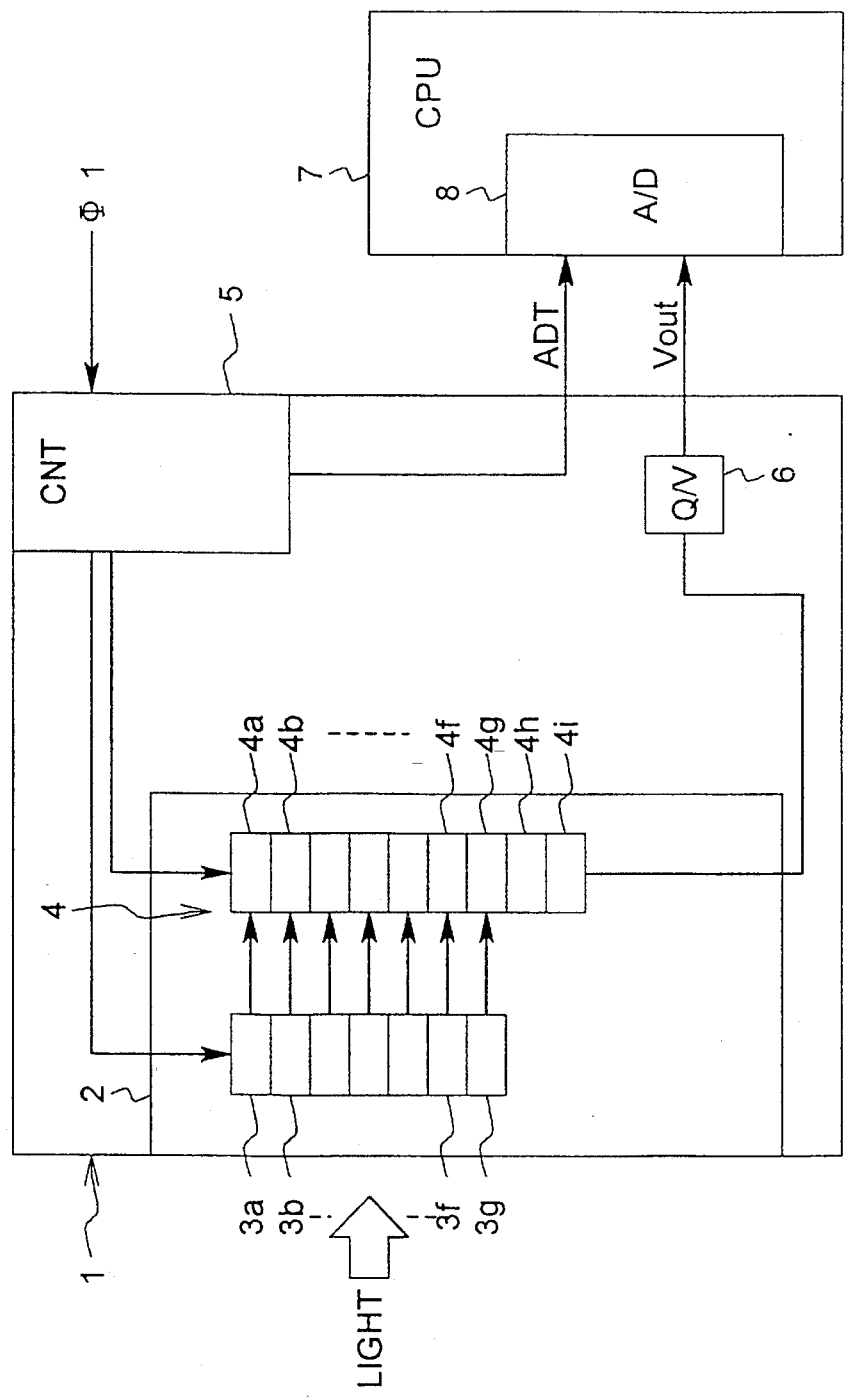
FIG. 8 is a functional block diagram showing the overall construction of a prior art one dimensional type photometric sensor.

FIG. 7 is a flow chart for outline explanation of the procedure followed by the microprocessor 80 for operation of the FIG. 6 camera. When a shutter release button of the camera which is not shown in the figures is pressed by the photographer as far as its first stroke position, the microcomputer 80 in the camera 90 starts to execute the program whose flow chart is shown in FIG. 7. First, in the step S1, separated photometry over the photographic field is performed by the photometric sensor 10. Next, in the step S2, the appropriate exposure is calculated according to a per se known algorithm, based upon the results of the photometry thus performed by the photometric sensor 10, and an exposure value is obtained. In the step S3, a decision is made as to whether or not the shutter release button is being pressed as far as its second stroke position so as to initiate photography by releasing the shutter, and if the shutter is being released then the flow of control proceeds to the step S4, while if not the flow of control returns to the step S1 and the above described processing is repeated. When the shutter is thus released, in the step S4 the shutter 100 and the iris 93 are drive controlled according to the calculated exposure values, and photography upon the film 101 is performed.

In this manner, the photometric sensor of the present invention is so constructed that: when this photometric sensor is outputting the photometric signals from the photoelectric conversion elements, a timing signal is output which is synchronized with the output of these photometric signals; while, when this photometric sensor is outputting the non required data from the relay CCD elements, no timing signal is output in synchronism with the output of these non required data items. Accordingly, it is possible to arrange for the microcomputer which inputs the photometric signals from this photometric sensor only to read in the output signal from the photometric sensor when the timing signal is being received, and not to read in this output signal when the timing signal is not being received; and the effect of this will be that the non required data output from the relay CCD elements will not be read in by the microcomputer, while on the other hand it will accurately read in all of the required data from the photometric sensor which represents actual photometry as performed by the photoelectric conversion elements.

In the embodiment described above, the explanation assumed by way of example that the photoelectric conversion elements were arranged in a two dimensional plane array, but in fact the present invention is also applicable to the case in which the photoelectric conversion elements are arranged in a one dimensional plane array, or indeed in other configurations. Further, it should not be considered that the present invention is limited by the number of photoelectric conversion elements shown in the exemplary embodiment, or by the number of rows of photoelectric conversion elements, or by the number of relay CCD elements. Other variations of the present invention, within the terms of the claims appended, may also be conceived of. Accordingly, although the present invention has been shown and described in terms of the preferred embodiment thereof, it is not to be considered as limited by any of the perhaps quite fortuitous details of this embodiment, or of the drawings, but only by the terms of the appended claims, which follow.

We claim:

1. A photometric sensor, comprising:

a plurality of photoelectric conversion elements which accumulate electric charge according to the intensity of the light which is incident upon them;

a CCD shift register, comprising a plurality of CCD (Charge Coupled Device) elements which correspond respectively to said plurality of photoelectric conversion elements, and at least one relay CCD element which does not correspond to any one of said photoelectric conversion elements, and which reads in the accumulated electric charges from said plurality of photoelectric conversion elements to said plurality of CCD elements and transmits them via said relay CCD element;

a charge to voltage conversion circuit which converts the accumulated electric charges transmitted from said CCD shift register into photometric signals and outputs them in order; and, a timing signal generation circuit which, when the photometric signals from said charge to voltage conversion circuit originating from said plurality of photoelectric conversion elements are output, outputs in synchronism with this output a timing signal, and, when a signal from said charge to voltage conversion circuit originating from said relay CCD element is output, does not output said timing signal in synchronism with this output.

2. A photometric sensor, comprising:

a plurality of photoelectric conversion elements arranged in a plane two dimensional array so as to constitute a plurality of photoelectric conversion element rows each extending in the X axis direction, which accumulate electric charge according to the intensity of the light which is incident upon them;

a plurality of X axis CCD shift registers respectively corresponding to said plurality of photoelectric conversion element rows, each comprising a plurality of CCD elements which respectively correspond to the photoelectric conversion elements included in the corresponding photoelectric conversion element row and at least one relay CCD element which does not correspond to any of said plurality of photoelectric conversion elements, and which reads in the accumulated electric charges from the photoelectric conversion elements included in the corresponding photoelectric conversion element row to said plurality of CCD elements and transmits them in the X axis direction via said relay CCD element;

a Y axis CCD shift register, comprising a plurality of CCD elements which respectively correspond to said plurality of X axis CCD shift registers, and at least one relay CCD element which does not correspond to any one of said plurality of X axis CCD shift registers, and which reads in the accumulated electric charges which are transmitted from said X axis CCD shift registers to said plurality of CCD elements and transmit them in the Y axis direction via said relay CCD element;

a charge to voltage conversion circuit which converts the accumulated electric charges transmitted from said Y axis CCD shift register into photometric signals and outputs them in order; and, a timing signal generation circuit which, when the photometric signals from said charge to voltage conversion circuit originating from said plurality of photoelectric conversion elements are output, outputs in synchronism with this output a timing signal, and, when a signal from said charge to voltage conversion circuit originating from said relay CCD element is output, does not output said timing signal in synchronism with this output.

3. A photometric sensor according to claim 2, wherein: said Y axis shift register comprises a plurality of relay CCD elements which do not correspond to any one of said plurality of X axis CCD shift registers, and a reference voltage is supplied to at least one of said plurality of relay CCD elements; and, said timing signal generation circuit outputs said timing signal also when a reference voltage signal, which originates from said relay CCD element to which said reference voltage is supplied, is output from said charge to voltage conversion circuit.

4. A photometric sensor, comprising:

a plurality of photoelectric conversion elements which accumulate electric charge according to the intensity of the light which is incident upon them;

a transmission means, comprising a plurality of transmission elements which correspond respectively to said plurality of photoelectric conversion elements, and at least one relay element which does not correspond to any one of said photoelectric conversion elements, and which reads in the accumulated electric charges from said plurality of photoelectric conversion elements to said plurality of transmission elements and transmits them via said relay element;

a charge to voltage conversion means which converts the accumulated electric charges transmitted from said shift transmission means into photometric signals and outputs them in order; and, a timing signal generation means which, when the photometric signals from said charge to voltage conversion means originating from said plurality of photoelectric conversion elements are output, outputs in synchronism with this output a timing signal, and, when a signal from said charge to voltage conversion means originating from said relay element is output, does not output said timing signal in synchronism with this output.

5. A photometric sensor, comprising:

a plurality of photoelectric conversion elements arranged in a plane two dimensional array so as to constitute a plurality of photoelectric conversion element rows each extending in the X axis direction, which accumulate electric charge according to the intensity of the light which is incident upon them;

a plurality of X axis transmission means respectively corresponding to said plurality of photoelectric conversion element rows, each comprising a plurality of transmission elements which respectively correspond to the photoelectric conversion elements included in the corresponding photoelectric conversion element row and at least one relay CCD element which does not correspond to any of said plurality of photoelectric conversion elements, and which reads in the accumulated electric charges from the photoelectric conversion elements included in the corresponding photoelectric conversion element row to said plurality of transmission elements and transmits them in the X axis direction via said relay element;

a Y axis transmission means, comprising a plurality of transmission elements which respectively correspond to said plurality of X axis transmission means, and at least one relay element which does not correspond to any one of said plurality of X axis transmission means, and which reads in the accumulated electric charges which are transmitted from said X axis transmission means to said plurality of transmission elements and transmit them in the Y axis direction via said relay element;

a charge to voltage conversion means which converts the accumulated electric charges transmitted from said Y axis transmission means into photometric signals and outputs them in order; and, a timing signal generation means which, when the photometric signals from said charge to voltage conversion means originating from said plurality of photoelectric conversion elements are output, outputs in synchronism with this output a timing signal, and, when a signal from said charge to voltage conversion means originating from said relay element is output, does not output said timing signal in synchronism with this output.

6. A photometric sensor according to claim 5, wherein:

said Y axis transmission means comprises a plurality of relay elements which do not correspond to any one of said plurality of X axis transmission means, and a reference voltage is supplied to at least one of said plurality of relay elements; and, said timing signal generation means outputs said timing signal also when a reference voltage signal, which originates from said relay element to which said reference voltage is supplied, is output from said charge to voltage conversion means.

\* \* \* \* \*